(12) United States Patent
Kliman et al.

(10) Patent No.: US 6,756,788 B2
(45) Date of Patent: Jun. 29, 2004

(54) LAMINATED CORE CONTACT DETECTION METHOD AND SYSTEM

(75) Inventors: Gerald Burt Kliman, Niskayuna, NY (US); Louis Tomaino, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 226 days.

(21) Appl. No.: 09/682,764

(22) Filed: Oct. 16, 2001

(65) Prior Publication Data

US 2003/0071630 A1 Apr. 17, 2003

(51) Int. Cl.$^7$ ............................................. G01R 31/06
(52) U.S. Cl. ....................................................... 324/545
(58) Field of Search ............................... 324/545, 529, 324/772, 240, 242, 243, 158.1, 127, 117 R, 117 H; 340/686.3

(56) References Cited

U.S. PATENT DOCUMENTS

| 4,996,486 A | * | 2/1991 | Posedel ........................ 324/545 |
| 5,805,664 A | * | 9/1998 | Whipple et al. ............. 378/117 |
| 6,489,781 B1 | * | 12/2002 | Kliman et al. ............... 324/545 |

FOREIGN PATENT DOCUMENTS

GB    2 044 936 A    8/1979

OTHER PUBLICATIONS

C. Rickson, et al, "Electrical Machine Core Imperfection Detection", IEEE Proceedings B (Electric Power Applications) vol. 133, No. 3, pp. 181–189.

JW Shelton, et al, "Introduction and Qualification of Digital Electromagnetic Core Imperfection Detector (El Cid) Test Equipment and Associated Robotic Delivery and Inspection Systems", Proceedings of the American Power Conference, vol. 56–II, 1994, pp. 1735–1742.

JW Shelton, et al, "A Comparative Analysis of Turbogenerator Core Inspection Techniques", Proceedings of the American Power Conference, vol. 47, pp. 643–650.

DJ Cadwell, et al, "Fast Gen III", The Proceedings of the American Power Conference, vol. 58–11, 1996, pp. 1249–1255.

J. Sutton, "Theory of Electromagnetic Testing of Laminated Stator Cores", Insight, vol. 36, No. 4, Apr. 1994, p. 246–251.

U.S. Patent Application, Ser. No. 09/575,715, Electronically Filed on Jul. 28, 2000, by Gerald B. Kliman, et al, Entitled "Method and System for Detecting Core Faults", Attorney Docket No. RD–28,251.

U.S. Patent Application, Ser. No. 09/681,802, Electronically Filed on Jun. 7, 2001 by GB Kliman, et al, Entitled "Method and System for Detecting Core Faults", Attorney Docket No. RD–28,507.

* cited by examiner

*Primary Examiner*—Evan Pert
*Assistant Examiner*—Jimmy Nguyen
(74) *Attorney, Agent, or Firm*—Ann M. Agosti; Patrick K. Patnode

(57) ABSTRACT

A core contact (meaning core fault or keybar contact) detection method comprises: positioning at least two electrically conductive plates near at least two respective laminations of a laminated core; supplying an excitation signal to the at least two electrically conductive plates; and using a resulting signal to detect variations in capacitance between the at least two electrically conductive plates representative of a core contact.

40 Claims, 5 Drawing Sheets

*Fig. 8*
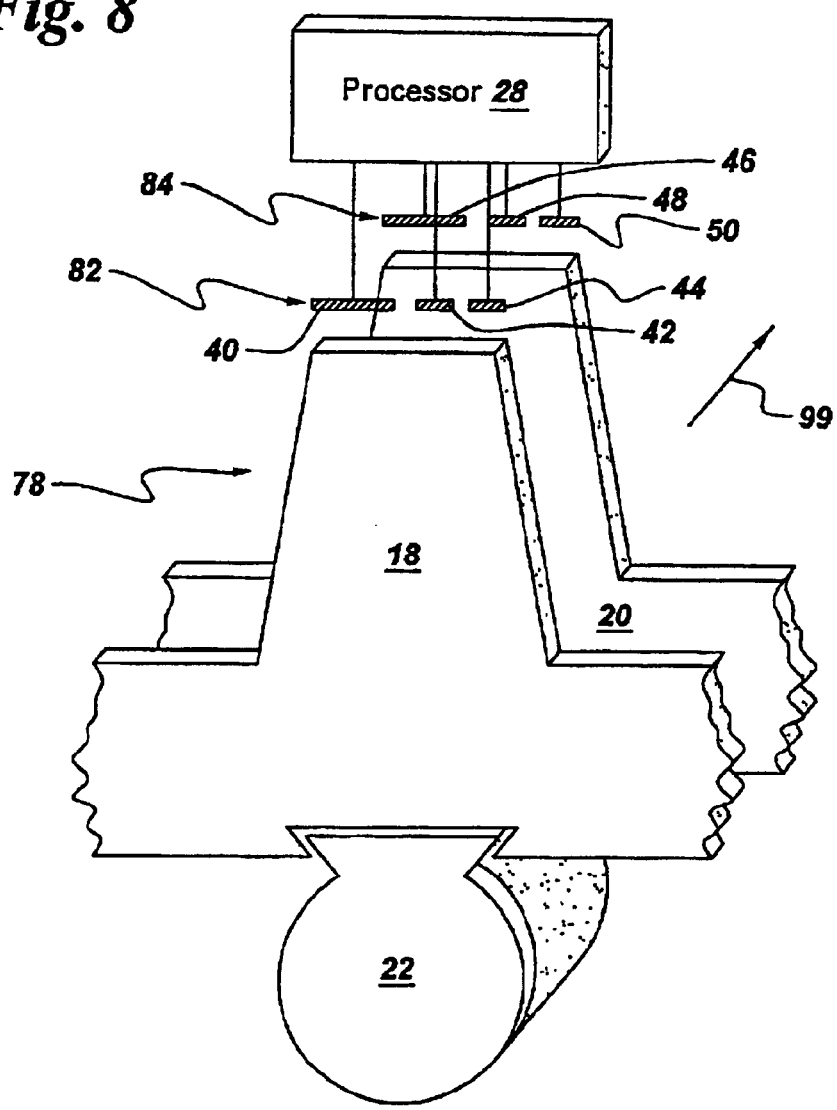
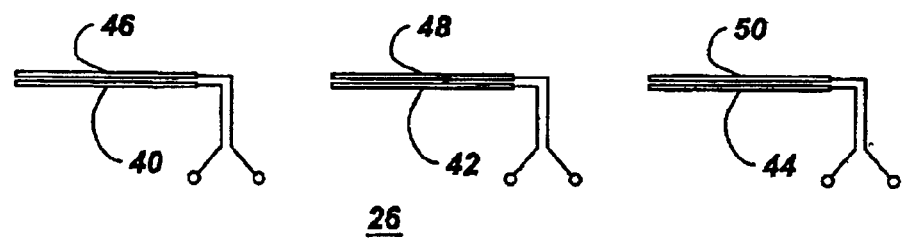
*Fig. 9*

LAMINATED CORE CONTACT DETECTION METHOD AND SYSTEM

BACKGROUND OF INVENTION

The invention relates generally to detecting core contacts (meaning keybar contacts or core faults due to interlamination short circuits).

Conventional large generator and motor laminations include a back iron, teeth and slots. Lamination segments (each about 250 micrometers to about 500 micrometers thick) are formed into a magnetic core by stacking. Typically a plurality of lamination segments (eighteen lamination segments each spanning twenty degrees, for one example) are used to form a complete first lamination with the next plurality of lamination segments forming a complete second lamination on top of and offset from the lamination segments in the first lamination. The stacking continues until formation of a short stack of about 2 centimeters to about 10 centimeters thick. A plurality of short stacks are further joined or clamped by bolts or other mechanical devices to form a stator core. A typical large generator stator core has a diameter ranging from about 1 meter to about 3 meters and a length ranging from about 1 meter to about 10 meters.

Laminated stator cores are tested for interlamination shorts during manufacture and during maintenance or service procedures. Core faults caused by short circuited laminations can be highly destructive, especially in large electric machines.

As described in commonly assigned Kliman et al., U.S. patent application Ser. No. 09/575,715, filed Jul. 28, 2000, core faults may be detected by positioning a magnetic yoke wound by a winding near at least one tooth of the core; supplying current to the winding to inject magnetic flux into the at least one tooth; measuring at least one signal resulting from the injected magnetic flux; and using the measured signal to detect core faults. When a small portion of the core is excited, if the laminations are well insulated from each other, the flux response to the excitation will be primarily due to the permeable core material as modified by normal hysterisis losses and eddy currents in the laminations. However, if faults exist anywhere in the excited region, circulating currents will be induced which will alter the magnitude and phase of the response. Such altered phases or magnitudes can be core condition indicators when used to compare one region of the core with another region of the core or to trend a single region over time. Additionally, analysis of the signal distribution for normal conditions and known fault conditions can be used to interpret measured signals in order to estimate core condition.

U.S. patent application Ser. No. 09/575,715 has several advantages as compared to prior embodiments. For example, short stacks of laminations can be tested individually while stacking during core fabrication or during core servicing so that, if a fault is located, remedial measures can be taken immediately on the affected lamination, and, if no fault is located, additional stacks can be formed and tested. In contrast, in prior embodiments, if a fault was later found in the middle of a completed core, a substantial portion of the core had to be un-stacked to gain access to the fault.

When the thickness of the magnetic yoke in U.S. patent application Ser. No. 09/575,715 exceeds the thickness of about two or three core laminations, sensitivity and selectivity are reduced since the magnetic yoke itself will influence the losses measured along the winding. Physical and practical constraints limit minimum yoke thicknesses however. Another factor that influences sensitivity is the distance between the magnetic yoke and the core laminations. About 50–75 micrometers of lamination stagger typically result from punching tolerances and assembly variability when fabricating laminated cores. In machines which function as generators, lamination core stagger is typically filled in and covered up by layers of thick paint. Such paint further increases the effective gap between the magnetic yoke and the core.

In another core fault detection technique, as described in commonly assigned Kliman et al., U.S. patent application Ser. No. 09/681,802, filed Jun. 7, 2001, a method for detecting core faults comprises (a) positioning a magnetic yoke near at least one tooth of the core, the magnetic yoke being wound by a winding and comprising two core-facing surfaces and at least one flux sensor situated on at least one of the two core-facing surfaces; (b) supplying current to the winding to inject magnetic flux into the at least one tooth of the core; (c) using the at least one flux sensor to measure a signal resulting from the injected magnetic flux; and (d) using the measured signal to detect variations in flux on the at least one core-facing surface representative of core faults.

The embodiments U.S. patent application Ser. Nos. 09/575,715 and 09/681,802 and most conventional core fault detection techniques operate effectively when core keybars are in physical and electrical contact with each lamination such that a current is passed through the laminations and keybars. In many cores, however, only a fraction of the laminations may be in contact with the keybars at the time the cores leave the factory. Thus, in such cores, potential faults will be missed by the conventional fault detection techniques.

It would therefore be desirable to have a core contact detection method with increased capability to detect core contacts due to keybar contacts and core faults between laminations.

SUMMARY OF INVENTION

Briefly, in accordance with one embodiment of the present invention, a core contact detection method comprises: positioning at least two electrically conductive plates near at least two respective laminations of a laminated core; supplying an excitation signal to the at least two electrically conductive plates; and using a resulting signal to detect variations in capacitance between the at least two electrically conductive plates representative of a core contact.

In accordance with another embodiment of the present invention, a core contact detection system comprises: at least two electrically conductive plates configured to be positioned near at least two respective laminations of a laminated core; and a processor configured for supplying an excitation signal to the at least two electrically conductive plates and using a resulting signal to detect variations in capacitance between the at least two electrically conductive plates representative of a core contact.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein:

FIG. 8 is a perspective and schematic view of a core and electrically conductive plates used for sensing core contacts in accordance with another embodiment of the present invention.

FIG. 9 is a top view of a configuration for the electrically conductive plates of FIG. 8.

DETAILED DESCRIPTION

Figure 1:
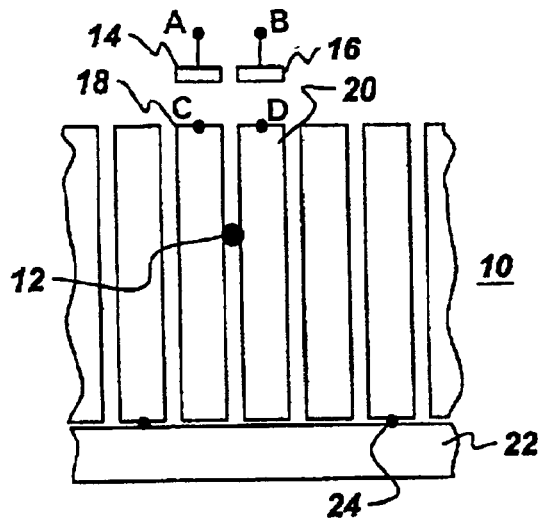
FIG. 1 is a partial side view of a core and electrically conductive plates used for sensing core contacts in accordance with one embodiment of the present invention.

FIG. 1 is a partial side view of a core 10 and electrically conductive plates 14 and 16 used for sensing core contacts in accordance with one embodiment of the present invention wherein a core contact detection method comprises positioning at least two electrically conductive plates 14 and 16 near at least two respective laminations 18 and 20 of a laminated core; supplying an excitation signal to the at least two electrically conductive plates; and using a resulting signal to detect variations in capacitance between the at least two electrically conductive plates representative of a core contact.

Figure 2:
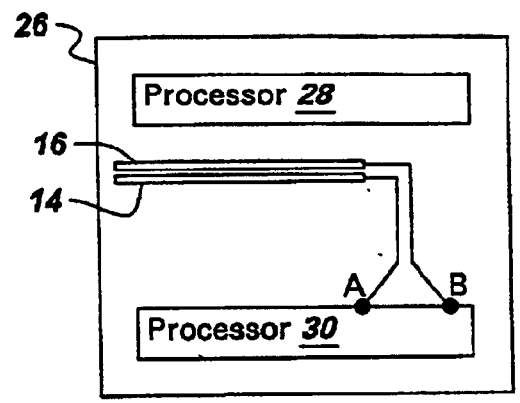
FIG. 2 is a top view of a configuration for the electrically conductive plates of FIG. 1.

FIG. 2 is a top view of a configuration for the electrically conductive plates of FIG. 1. As used herein "near" is meant to include close enough proximity (without touching) such that the resulting signal has sufficient resolution for contact detection. Typically the distance between an electrically conductive plate and the core ranges from about 200 micrometers to about 500 micrometers, for example. FIG. 1 additionally illustrates a keybar 22, desirable keybar connections 24, and an undesirable interlamination fault 12.

Electrically conductive plates may be configured (fabricated) to be positioned near at least two respective laminations 18 and 20 of a laminated core in any appropriate manner. In one embodiment, as shown in FIG. 2, the electrodes are configured by being patterned on a substrate 26 which additionally includes a processor (meaning one or more processors 28, 30). Substrate 26 may comprise any structurally suitable insulating material with several examples being a plastic film and a printed circuit board.

Electrically conductive plates 14 and 16 may comprise any electrically conductive material. In one example the electrically conductive plates comprise copper. In a more specific embodiment, copper electrically conductive plates have thicknesses on the order of about 50 micrometers to about 200 micrometers, lengths on the order of about 3.5 centimeters to about 4 centimeters, and widths on the order of about 250 micrometers to about 500 micrometers.

One or more processors 28 and 30 may comprise analog, digital, or a combination of analog and digital components to provide excitation signals and process resulting signals. It is useful but not necessary to integrate the processor on a common substrate 26 with the electrically conductive plates.

Figure 14:
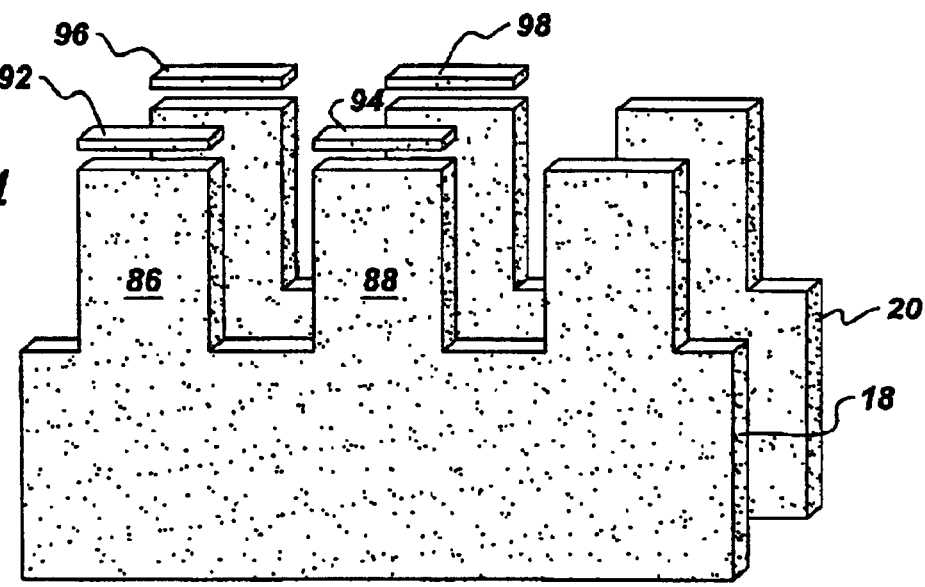
FIG. 14 is a perspective view of a core and electrically conductive plates used for sensing core contacts in accordance with another embodiment of the present invention.

In one embodiment, the detection method further comprises moving the at least two electrically conductive plates axially relative to the laminated core while a plurality of resulting measured signals are obtained and used to detect core contacts. In one embodiment, as shown in FIG. 8, the at least two electrically conductive plates are positioned near and axially moved along a single tooth 78 in a direction represented by arrow 99. In another embodiment, as shown in FIG. 14, the at least two electrically conductive plates are positioned near and moved along at least two respective teeth 86, 88. In either embodiment, it is useful to repeat the process along additional teeth or sets of teeth around the inner perimeter of the core.

For purposes of example, in the embodiment of FIG. 1, electrically conductive plates 14 and 16 are positioned near at least two respective adjacent laminations 18 and 20 of the laminated core. "Adjacent" is used to indicate that there is only one lamination joint in the space between the electrically conductive plates even though the plates themselves may span one or more laminations and lamination joints.

One challenge when taking the measurements is alignment. If electrically conductive plates having widths on the order of about the thickness of one lamination are used, then alignment involves aligning each electrically conductive plate relative to its respective lamination. If electrically conductive plates having widths on the order of thicknesses of two to three laminations are used, the alignment becomes less difficult. In some embodiments even wider electrodes are used. In these embodiments, the alignment will be focussed on the space between the electrically conductive plates. In general it is expected that the maximum sensitivity will be when the electrodes span a fault and that reduced sensitivity will occur when one of the electrodes is positioned over a fault. Lamination joint gaps (particularly between adjacent segments of laminations in a stack) may have an effect on sensitivity. Increasing the width of the electrically conductive plates is expected to ameliorate the effect.

Directly obtaining the capacitances between the electrically conductive plates and the respective laminations is difficult due to the small capacitance values which are typically on the order of picofarads, current values typically on the order of microamperes, and voltage values on the order of microvolts. For whatever detection technique is selected, noise reduction is very beneficial. Additionally, high frequency excitation signals are useful for improving resolution of the resulting signal. In one embodiment, the excitation signal comprises a signal frequency greater than or equal to about 50 Hz. In a more specific embodiment, the excitation signal comprises a signal frequency greater than about 100 kHz.

Figure 3:
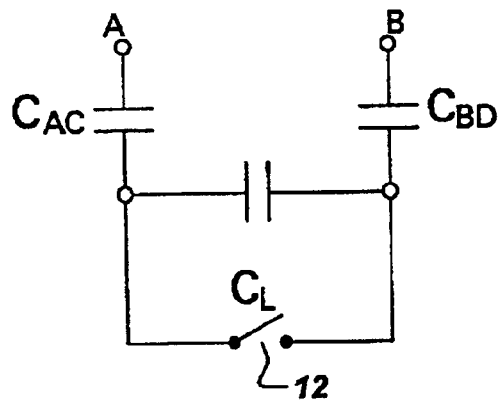
FIG. 3 is an equivalent circuit diagram representing the capacitances generated by the electrically conductive plates and core laminations of FIG. 1.

FIG. 3 is an equivalent circuit diagram representing the capacitances generated by the electrically conductive plates and core laminations of FIG. 1. Two parallel plate capacitors $C_{AC}$ and $C_{BD}$ are formed with electrically conductive plates 14 and 16 each forming a first plate and the underlying lamination or laminations forming a second plate of each respective capacitor.

If there is no contact (that is, there is no electrical contact (from either a fault or from keybar contacts) between laminations 18 and 20) the capacitance of capacitor $C_L$ will be large compared to either of the capacitances of $C_{AC}$ and $C_{BD}$. When the capacitance of $C_{AC}$ is selected to be approximately the same as that of $C_{BD}$, the equivalent capacitance across electrically conductive plates 14 and 16 approximates the following if there is no fault or keybar contact:

$$C_{eq} = \tfrac{1}{2} C_{AC} * 1/(1 + \tfrac{1}{2}(C_{AC}/C_L)) = C_{AB},$$

If a fault (represented as fault 12 in FIGS. 1 and 3, for example) or keybar contact (represented as contact 24 in FIG. 2, for example) is present, effectively connection 12 is in place and the equivalent capacitance approximates $\tfrac{1}{2} C_{AC}$.

Figure 4:
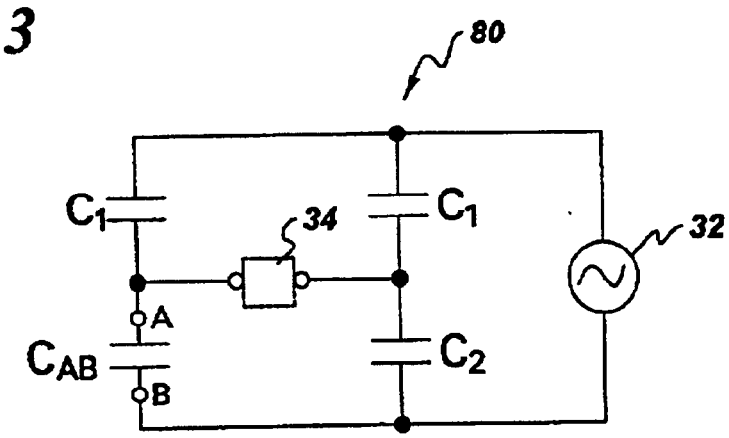
FIG. 4 is a bridge circuit representing one embodiment for use in signal measurement in conjunction with the electrically conductive plates of FIG. 1.

FIG. 4 is a bridge circuit representing one embodiment for use in improving signal measurement in conjunction with the electrically conductive plates of FIG. 1. By incorporating the electrically conductive plates into a bridge, the presence or absence of contact may be discerned by the level of a signal measured by signal detector 34. Signal detector 34 may comprise a current or voltage sensor, for example. In a voltage sensing example, a 10 volt excitation source 32 comprising an excitation frequency of about 100 kHz will result in a measurement of about 6 microvolts across signal detector 34 in the presence of a fault or keybar contact. In one embodiment, the capacitances of $C_1$ and $C_2$ are selected to be approximately the same as the capacitance of $C_{AB}$. Typically the capacitance of $C_{AB}$ is expected to be on the order of several picofarads.

It can be difficult to determine whether a measurement indicating a contact is due to an undesired fault or a desired keybar contact. For this reason, it is beneficial to integrate the fault detection techniques of either of aforementioned U.S. patent application Ser. Nos. 09/575,715 and 09/681,802 with the present contact detection technique. The integration may be via two separate measurement systems or by a system which shares one or more common processors 38 and 30 and which alternatively or additionally may include a detector with the electrically conductive plates being mounted on the magnetic yoke (not shown).

Figure 5:
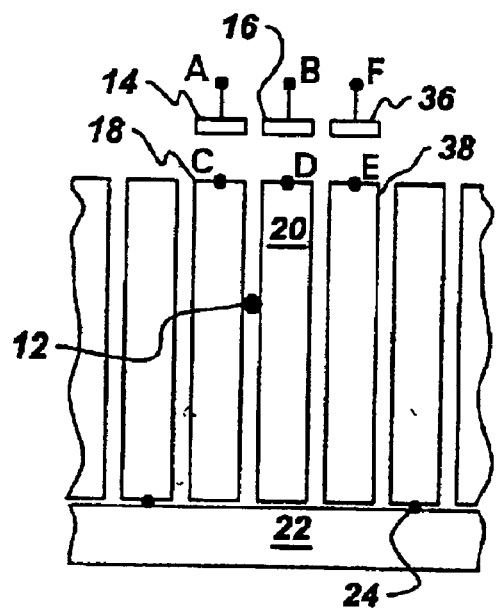
FIG. 5 is a partial side view of a core and electrically conductive plates used for sensing core contacts in accordance with another embodiment of the present invention.
Figure 6:
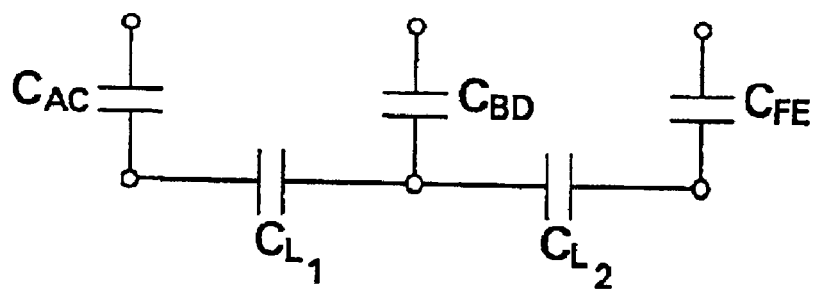
FIG. 6 an equivalent circuit diagram representing the capacitances generated by the electrically conductive plates and core laminations of FIG. 5.
Figure 7:
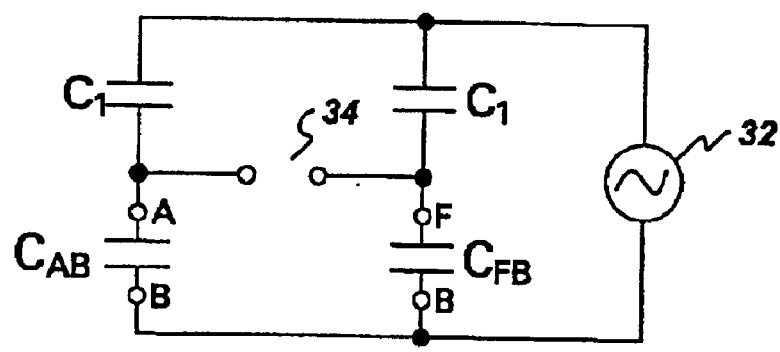
FIG. 7 is a bridge circuit representing one embodiment for use in signal measurement in conjunction with the electrically conductive plates of FIG. 5.

FIG. 5 is a partial side view of a core and electrically conductive plates used for sensing core contacts in accordance with another embodiment of the present invention wherein at least three electrically conductive plates 14, 16, 36 are positioned near at least three respective laminations 18, 20, 38 of a laminated core. FIG. 6 is an equivalent circuit diagram representing the capacitances generated by the electrically conductive plates and core laminations of FIG. 5, and FIG. 7 is a bridge circuit representing one embodiment for use in signal measurement in conjunction with the electrically conductive plates of FIG. 5. The embodiment of FIGS. 5–7 is expected to have improved sensitivity as compared with the embodiment of FIGS. 1–4. In one example, as the three electrically conductive plates are scanned over the core, in response to a contact, the resulting signal across signal detector 34 of FIG. 7, when bridging the outer electrically conductive plates 14 and 36 as shown, will first be positive and then negative in response to a contact. As discussed above, the width of the electrically conductive plates may be such that each of the electrically conductive plates spans multiple laminations. In the bridge circuit of FIG. 7, the capacitances $C_{AB}$ and $C_{FB}$ represent equivalent capacitances seen at the terminals (electrically conductive plates) and are not plate-to-lamination capacitances as shown in the circuit diagram of FIG. 6.

FIG. 8 is a perspective and schematic view of a core and electrically conductive plates used for sensing core contacts in accordance with another embodiment of the present invention, and FIG. 9 is a top view of a configuration for the electrically conductive plates of FIG. 8. The embodiments of FIGS. 1–4 and FIGS. 5–7 operate most efficiently when laminations 18 and 20 are each approximately the same height. Typically, however, about 50 micrometers to about 100 micrometers of stagger exists with respect to lamination heights. Depending upon the amount of stagger and the strength of the resulting signal, the effects of stagger have the capacity to dominate the fault signal in many instances.

The embodiment of FIGS. 8–9 is one example of a stagger compensation technique wherein at least two sets 82, 84 of electrically conductive plates 40, 42, 44, 46, 48, 50 are positioned near at least two respective laminations 18, 20 of a laminated core. The embodiment of FIGS. 8–9 further illustrates each set of electrically conductive plates comprising three electrically conductive plates linearly arranged with respect to at least one of the at least two respective laminations. Linearly arranged means that the electrically conductive plates are aligned side by side each other with respect to the at least one lamination as shown in FIG. 8. Although FIG. 8 illustrates two sets 82, 84 of electrically conductive plates with each being aligned to one respective lamination, the invention is not limited to this embodiment. As discussed above, the width of the electrically conductive plates may be such that each of the electrically conductive plates spans multiple laminations. Likewise, although FIG. 8 illustrates an embodiment wherein the electrically conductive plates are situated along a common tooth 78, the present invention is not intended to be limited to such embodiments.

The additional electrically conductive plates can be used to factor differences in capacitance due to differences in distance between electrically conductive plates and laminations. Any one of a number bridges, analog circuitry, digital processing, or combinations thereof can be used to detect a core contact with increased sensitivity. Several more specific detection embodiments are described with respect to FIGS. 10 and 11 wherein a first set 82 of electrically conductive plates comprises a first signal plate 44 and a first pair of baseline plates 40 and 42, and a second set 84 of electrically conductive plates comprises a second signal plate 46 and a second pair of baseline plates 48 and 50.

Figure 10:
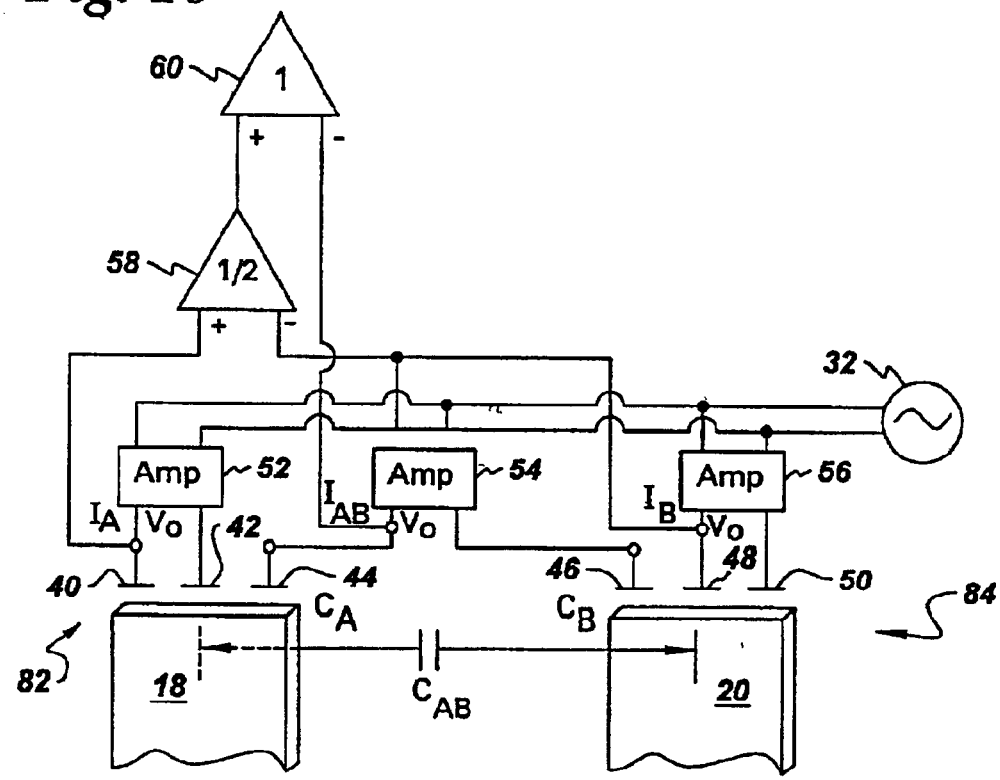
FIG. 10 is a circuit diagram of a configuration for signal detection and analysis for use with the embodiment of FIG. 9.

FIG. 10 is a circuit diagram of a configuration wherein excitation source 32 supplies the excitation to first pair of baseline plates 40 and 42, the second pair of baseline plates 48 and 50, and first and second signal plates 44 and 46, and wherein a core contact is detected by obtaining a fraction of the sum (via fractioner 58 for example) of resulting signals obtained from the first and second pairs of baseline plates, and subtracting (via subtractor 60 for example) a signal resulting from the first and second signal plates from the fractioned sum.

More specifically, if excitation source 32 applies the same voltage and frequency through amplifiers 52, 54, and 56, and if the electrically conductive plates are approximately the same (that is, have approximately the same size, shape, and material), the currents in the baseline plates are expected to be slightly less than that of the currents in the signal plates if there is contact between laminations 18 and 20 (that is if there is a short circuit in place of $C_{AB}$). Hence if the current of a baseline capacitor is subtracted from the current of a signal capacitor, only the current due to the difference will remain. However, because adjacent laminations may have different effective gaps, it is particularly useful to take both into account. The embodiment of FIG. 10 sums and fractions the currents (at fractioner 58, for example) due to the baseline plates and subtracts (with subtractor 60, for example) the fractioned sum from the current due to the signal plate. When the electrically conductive plates are approximately the same, the fractioner comprises an averager. In another embodiment, conductive plates 40, 42, 48, and 50 are approximately the same as each other, and conductive plates 44 and 46 are approximately the same as each other but different than conductive plates 40, 42, 48, and 50.

Figure 11:
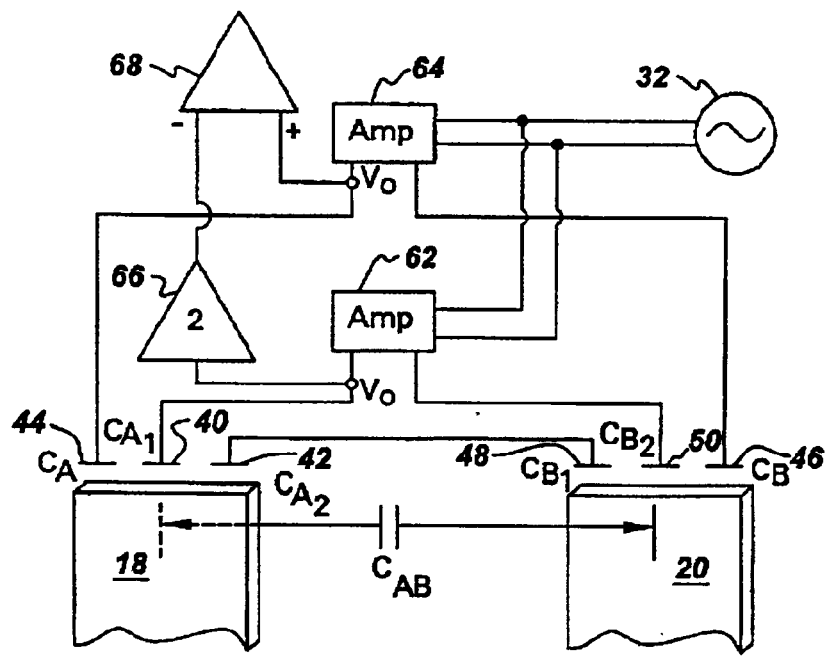
FIG. 11 is a circuit diagram of another configuration for signal detection and analysis for use with the embodiment of FIG. 9.

FIG. 11 is a circuit diagram of another configuration wherein excitation source 32 supplies the excitation signal to a first plate 40 of the first pair of baseline plates 40 and 42, to a first plate 50 of the second pair of baseline plates 48 and 50, and to the first and second signal plates 44 and 46, wherein a second plate 42 of the first pair of baseline plates and a second plate 48 of the second pair of baseline plates are electrically coupled, and wherein a core contact is detected by multiplying (with multiplier 66, for example) a signal representative of the voltage across the first plates of the first and second pairs of baseline plates, and subtracting (with subtractor 68, for example) the multiplied signal from a signal representative of a voltage across the first and second signal plates. When the electrically conductive plates are approximately the same, the multiplier may comprise a doubler, for example. The embodiment of FIG. 11 uses two amplifiers 62 and 64 as compared with the three amplifiers used in the embodiment of FIG. 10.

Figure 12:
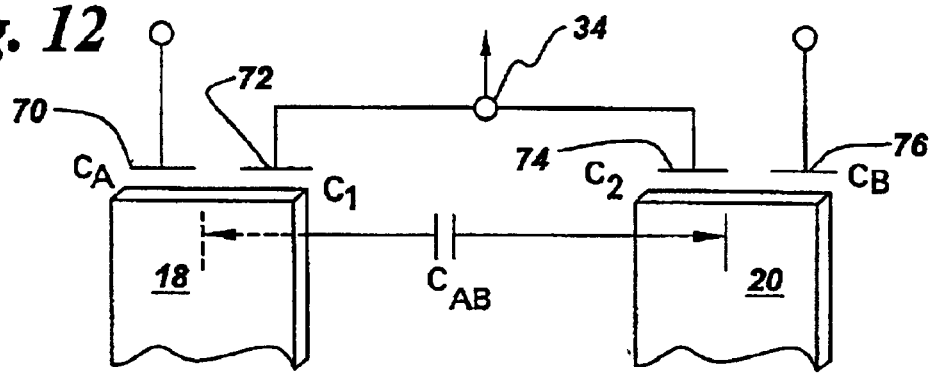
FIG. 12 is a perspective and schematic view of a core and electrically conductive plates used for sensing core contacts in accordance with another embodiment of the present invention.
Figure 13:
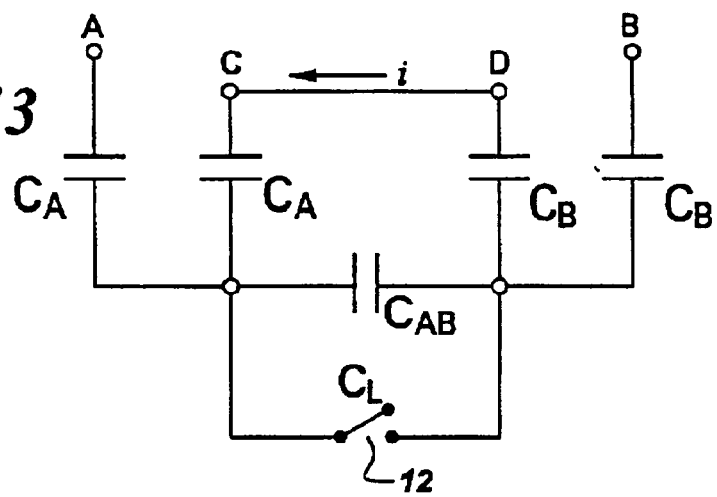
FIG. 13 an equivalent circuit diagram representing the capacitances generated by the electrically conductive plates and core laminations of FIG. 12.

FIG. 12 is a perspective and schematic view of a core and electrically conductive plates used for sensing core contacts in accordance with another embodiment of the present invention, and FIG. 13 an equivalent circuit diagram representing the capacitances generated by the electrically conductive plates and core laminations of FIG. 12.

In the embodiment of FIG. 12, each set of electrically conductive plates comprises one signal plate 70, 76 and one sense plate 72, 74 linearly arranged with respect to at least one of the at least two respective laminations. An excitation signal is supplied to the signal plates and a resulting signal is obtained from the sense plates. In one embodiment, the sense plates of two of the at least two sets are electrically connected, and a current signal is obtained from the electrically coupled sense plates. In another embodiment, a voltage signal representative of the voltage across the sense plates is obtained. In either embodiment, the magnitude (or more specifically the presence or absence) of the resulting current or voltage signal can be used to detect the absence or presence of a core contact.

FIG. 14 is a front view of a core and electrically conductive plates 92, 94, 96, and 98 used for sensing core contacts in accordance with another embodiment of the present invention. This embodiment is similar to that of FIG. 12 except that, rather than positioning each electrically conductive plate positioned near one tooth of the core, the sense plates are positioned near at least one separate tooth of the core than the signal plates. In a more specific embodiment, electrically conductive plates 92 and 96 are situated near separate laminations 18 and 20 of tooth 86 and comprise signal plates which receive an excitation signal from an excitation source (not shown in FIG. 14). Electrically conductive plates 94 and 96 comprises sense plates situated near separate laminations 18 and 20 of tooth 88. As discussed with respect to FIG. 12, an excitation signal is supplied to the signal plates and a resulting signal is obtained from the sense plates. In one embodiment, the sense plates of two of the at least two sets are electrically connected, and a current signal is obtained from the electrically coupled sense plates. In another embodiment, a voltage signal representative of the voltage across the sense plates is obtained.

The previously described embodiments of the present invention have many advantages, including the ability to detect core contacts and thus help identify potential core faults.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A core contact detection method comprising:
    (a) positioning at least two electrically conductive plates near at least two respective laminations of a laminated, core;
    (b) supplying an excitation signal to the at least two electrically conductive plates; and
    (c) using a resulting signal to detect variations over time in capacitance between the at least two electrically conductive plates representative of a core contact.

2. The method of claim 1 wherein (a) comprises positioning the at least two electrically conductive plates near at least two respective adjacent laminations of the laminated core.

3. The method of claim 1 wherein (a) comprises positioning the at least two electrically conductive plates near the at least two respective laminations of the laminated core along at least one tooth of th laminated core.

4. The method of claim 3 further comprising moving the at least two electrically conductive plates axially relative to the at least one tooth while repeating (a)–(c) and using the plurality of resulting measured signals to detect core contacts.

5. The method of claim 1 wherein (a) comprises positioning the at least two electrically conductive plates near the at least two respective laminations of the laminated core along at least two teeth of the laminated core.

6. The method of claim 5 further comprising moving the at least two electrically conductive plates axially relative to the at least two teeth while repeating (a)–(c) and using the plurality of resulting measured signals to detect core contacts.

7. The method of claim 1 wherein (b) comprises supplying the excitation signal to the at least two electrically conductive plates through a bridge circuit.

8. The method f claim 1 wherein (a) comprises positioning at least three electrically conductive plates near at least three respective laminations of a laminated core.

9. The method of claim 8 wherein (b) comprises supplying the excitation signal to the at least three electrically conductive plates through a bridge circuit.

10. The method of claim 1 wherein (a) comprises positioning at least two sets of electrically conductive plates near at least two respective laminations of a laminated core.

11. The method of claim 10 wherein each set of electrically conductive plates comprises three electrically conductive plates linearly arranged with respect to at least one of the at least two respective laminations.

12. The method of claim 11 wherein a first set of the at least two sets of electrically conductive plates comprises a first signal plate and a first pair of baseline plates, wherein a second set of the at least two sets of electrically conductive plates comprises a second signal plate and a second pair of baseline plates,
   wherein (b) comprises supplying the excitation signal to the first pair of baseline plates, supplying the excitation signal to the second pair of baseline plates, and supplying the excitation signal to the first and second signal plates, and
   wherein (c) comprises obtaining a fractioned signal of the resulting signals obtained from the first and second pairs of baseline plates, and subtracting a signal resulting from the first and second signal plates from the fractioned signal.

13. The method of claim 11 wherein a first set of the at least two sets of electrically conductive plates comprises a first signal plate and a first pair of baseline plates, wherein a second set of the at least two sets of electrically conductive plates comprises a second signal plate and a second pair of baseline plates, and,
   wherein (b) comprises supplying the excitation signal to a first plate of the first pair of baseline plates, supplying the excitation signal to a first plate of the second pair of baseline plates, and supplying the excitation signal to the first and second signal plates,
   wherein a second plate of the first pair of baseline plates and a second plate of the second pair of baseline plates are electrically coupled, and
   wherein (c) comprises multiplying a signal representative of the voltage across the first plates of the first and second pairs of baseline plates, and subtracting the multiplied signal from a signal representative of a voltage across the first and second signal plates.

14. The method of claim 10 wherein each set of electrically conductive plates comprises one signal plate and one sense plate linearly arranged with respect to at least one of the at least two respective laminations.

15. The method of claim 14 wherein the sense plates of two of the at least two sets are electrically coupled,
   wherein (b) comprises supplying the excitation signal to the signal plates of the two of the at least two sets, and
   wherein (c) comprises obtaining a current signal tram the electrically coupled sense plates.

16. The method of claim 14 wherein (b) comprises supplying the excitation signal to the signal plates of the two of the at least two sets, and wherein (c) comprises obtaining a voltage signal representative of the voltage across the sense plates.

17. The method of claim 14 wherein (a) comprises positioning each set of electrically conductive plates near one tooth of the core.

18. The method of claim 14 wherein (a) comprises positioning the sense plates near at least one separate tooth of the core than the signal plates.

19. A core contact detection method comprising:
   (a) positioning at least two electrically conductive plates near at least two respective adjacent laminations along at least one tooth of a laminated core:
   (b) supplying an excitation signal to the at least two electrically conductive plates;
   (c) using a resulting signal to detect variations over time in capacitance between the at least two electrically conductive plates representative of a core contact; and
   (d) moving the at least two electrically conductive plates axially relative to the at least one tooth while repeating (a)–(c) and using the plurality of resulting measured signals to detect core contacts.

20. The method of claim 19 wherein (b) comprises supplying the excitation signal to the at least two electrically conductive plates through a bridge circuit.

21. The method of claim 19 wherein (a) comprises positioning at least two sets of electrically conductive plates.

22. The method of claim 21, wherein each set of electrically conductive plates comprises three electrically conductive plates linearly arranged with respect to at least one of the at least two respective laminations.

23. The method of claim 21 wherein each set of electrically conductive plates comprises one signal plate and one sense plate linearly arranged with respect to at leant one of the at least two respective laminations.

24. The method of claim 23 wherein the sense plates of two of the at least two sets are electrically coupled,
   wherein (b) comprises supplying the excitation signal to the signal plates of the two of the at least two sets, and
   wherein (c) comprises obtaining a current signal from the electrically coupled sense plates.

25. The method at claim 23 wherein (b) comprises supplying the excitation signal to the signal plates of the two of the at least two sets, and wherein (o) comprises obtaining a voltage signal representative of the voltage across the sense plates.

26. The method of claim 23 wherein (a) comprises positioning each set of electrically conductive plates near one tooth of the core.

27. The method of claim 23 wherein (a) comprises positioning the sense plates near at least one separate tooth of the core than the signal plates.

28. A core contact detection system comprising:
   (a) at least two electrically conductive plates configured to be positioned near at least two respective laminations of a laminated core; and
   (b) a processor configured for supplying an excitation signal to the at least two electrically conductive plates and using a resulting signal to detect variations over time in capacitance between the at least two electrically conductive plates representative of a core contact.

29. The system of claim 1 further comprising a substrate, wherein the at least two electrically conductive plates are situated on the substrate.

30. The system of claim 29 wherein the processor is integrated on the substrate.

31. The system of claim 29 wherein the substrate is a plastic film or a printed circuit board.

32. The system of claim 28 wherein the at least two electrically conductive plates comprise copper.

33. The system of claim 28 further comprising a bridge circuit coupled between an excitation source and the at least two electrically conductive plates.

34. The system of claim 28 wherein the at least two electrically conductive plates comprise at least two sets of electrically conductive plates.

35. The system of claim 34 wherein each set of electrically conductive plates comprises three linearly arranged electrically conductive plates.

36. The system of claim 35 wherein a first set of the at least two sets of electrically conductive plates comprises a first signal plate and a first pair of baseline plates, wherein a second set of the at least two sets of electrically conductive plates comprises a second signal plate and a second pair at baseline plates, and wherein the processor is configured for supplying the excitation signal to the first pair of baseline plates, supplying the excitation signal to the second pair of baseline plates, supplying the excitation signal to the first and second signal plates, obtaining a fractioned signal of the resulting signals obtained from the first and second pairs of baseline plates, and subtracting a signal resulting from the first and second signal plates from the fractioned signal.

37. The system of claim 35 wherein a first set of the at least two sets of electrically conductive plates comprises a first signal plate and a first pair of baseline plates, wherein a second set of the at least two sets of electrically conductive plates comprises a second signal plate and a second pair of baseline plates, wherein a second plate of the first pair at baseline plates and a second plate of the second pair of baseline plates are electrically coupled and, wherein the processor is configured for supplying the excitation signal to a first plate of the first pair of baseline plates, supplying the excitation signal to a first plate of the second pair of baseline plates, and supplying the excitation signal to the first and second signal plates, multiplying a signal representative of the voltage across the first plates of the first end second pairs of baseline plates, and subtracting the multiplied signal from a signal representative of a voltage across the first and second signal plates.

38. The system of claim 34 Wherein each set of electrically conductive plates comprises one signal plate and one sense plate linearly arranged.

39. The system of claim 38 wherein the baseline plates of two of the at least two sets are electrically coupled, and wherein the processor is configured for supplying the excitation signal to the signal plates of the two of the at least two sets, and obtaining a current signal from the electrically coupled baseline plates.

40. The system of claim 38 wherein the processor is configured for supplying the excitation signal to the signal plates of the two of the at least two sets, and obtaining a voltage signal representative of th voltage across the baseline plates.

\* \* \* \* \*